(12) United States Patent
Vandanapu et al.

(10) Patent No.: US 8,502,706 B2
(45) Date of Patent: Aug. 6, 2013

(54) BIT ALLOCATION FOR ENCODING TRACK INFORMATION

(75) Inventors: Naveen Kumar Vandanapu, Andhra Pradesh (IN); Srinivas Reddy Bhavanam, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 2721 days.

(21) Appl. No.: 10/741,304

(22) Filed: Dec. 18, 2003

(65) Prior Publication Data

US 2005/0137865 A1 Jun. 23, 2005

(51) Int. Cl.
*H03M 7/00* (2006.01)
(52) U.S. Cl.
USPC .............................................. 341/50; 341/51

(58) Field of Classification Search
USPC ........................................ 341/50, 51; 704/219
See application file for complete search history.

(56) References Cited

U.S. PATENT DOCUMENTS 6,728,669 B1 * 4/2004 Benno ........................... 704/219

OTHER PUBLICATIONS

Benyassine et al. (A Silence Compression Scheme for Use With G.729 Optimized for V.70 Digital Simultaneous Voice and Data Applications, IEEE), Sep. 1997.*

* cited by examiner

*Primary Examiner* — Jean B Jeanglaude
(74) *Attorney, Agent, or Firm* — Blakely, Sokoloff, Taylor & Zafman LLP

(57) ABSTRACT

Allocating bits in an encoding scheme to reduce the number of bits required to send starting track information. In one embodiment a joint starting track indicator is sent with a frame to indicate the starting tracks for all subframes in the frame.

20 Claims, 5 Drawing Sheets

| | Joint Starting Track Indicator | Subframe 0 Starting Track | Subframe 1 Starting Track | Subframe 2 Starting Track |
|---|---|---|---|---|
| 411 | 00000 | T0 | T0 | T0 |
| 412 | 00001 | T0 | T0 | T1 |
| 413 | 00010 | T0 | T0 | T2 |
| 414 | 00011 | T0 | T1 | T0 |
| | ⋮ | ⋮ | ⋮ | ⋮ |
| 415 | 01101 | T1 | T1 | T1 |
| 416 | 01110 | T1 | T1 | T2 |
| 417 | 01111 | T1 | T2 | T0 |
| | ⋮ | ⋮ | ⋮ | ⋮ |
| 418 | 10111 | T2 | T1 | T2 |
| 419 | 11000 | T2 | T2 | T0 |
| 420 | 11001 | T2 | T2 | T1 |
| 421 | 11010 | T2 | T2 | T2 |

FIG. 4

BIT ALLOCATION FOR ENCODING TRACK INFORMATION

FIELD

Embodiments of the invention relate to encoding track information in codecs. Specifically, the disclosure relates to bit allocation for jointly encoding track information from multiple subframes.

BACKGROUND

Speech compression in traditional voice communication systems provides more efficient use of bandwidth than sending uncompressed signals, because the systems are enabled to transfer more data within the same bandwidth allocation. Speech compression is a technique for representing an analog speech signal in digital format with as few bits as possible, while preserving signal quality. The number of bits used to represent the speech signal directly affects the bit rate of the encoder, with higher bit rates requiring more bandwidth. Thus, a lower encoding bit rate would generally result in a more efficient use of bandwidth.

Furthermore, speech encoders and decoders typically operate under time constraints in which the compression/decompression should occur. Thus, the goals in the design of a speech codec (coder/decoder) are generally to minimize the bit rate of the encoded speech signal, while reducing the complexity of the speech compression algorithms and minimizing delay in encoding. Although a design seeks to reduce complexity and minimize delay, another goal is to preserve the speech quality of the signal.

Speech compression standards are often used as design guides in designing speech codecs, because many of the above issues have been contemplated in the standards, and codecs implementing the standards may be interoperable with other devices supporting the standards. The speech compression standards may set forth a bit allocation scheme for the encoder, such as defining a frame of data with certain bit positions within the frame having a standard meaning. Such frames may be subdivided into two or more subframes, and each subframe may include several data tracks. The bit allocation scheme encodes the parameters as a sequence of bits and hence encodes pulse positions and/or signs as a sequence of bits. The whole of the information represented in the various pulses of the various tracks defines an excitation vector used to encode the data in a set number of digital bits. A receiving decoder uses the encoded bit stream to generate excitation vectors to decode the compressed signal.

Some standards may provide for an uneven distribution of pulses among the tracks, such that one or more tracks may include an extra pulse(s). Thus, the encoder should include an indication of which track(s) include extra pulse(s) in the frame sent to the decoder. This indicator is often referred to as indicating the starting track, meaning the first track with extra pulses. The track indicator may be a set of bits sent with each subframe indicating which track in the subframe is the starting track.

One compression standard is the Algebraic-Code-Excited Linear-Prediction (ACELP), with a derivative being Conjugate-Structure ACELP (CSACELP). The ITU-T (International Telecommunication Union Telecommunication Standardization Sector) has defined the G.729 digital transmission system standard based on CSACELP. As with other speech coding standards, ITU-T G.729 specifies a coding bit rate. G.729 is defined to operate at 8.0 kbit/s for compression of normal speech signals, with extension G.729E defined to operate at 11.8 kbit/s for compression of a wider range of signals, including speech with noise, music, etc. G.729E defines 2 subframes, each with 5 tracks, each track containing 8 pulse positions, for a total of 40 pulse positions in which to define an excitation vector in the frame. The pulse positions are interleaved in such a way that track T0 has positions (0, 5, 10, . . . ), T1 has positions (1, 6, 11, . . . ), and so forth.

G.729E specifies the use of 12 pulses, meaning there will be an uneven distribution of pulses across the five tracks. Accordingly, two of the five tracks have three pulses, and the other three have two pulses. One of the two tracks with an extra pulse is identified as a starting track, which is indicated to the decoder for proper decoding alignment. A starting track indicator is sent at the beginning of each subframe, using 3 bits each to indicate one of the five tracks. But note that because three bits are used, there will be three unused combinations. This means that in a frame with two subframes, there will be three unused combinations in each of the two starting track indicators.

BRIEF DESCRIPTION OF THE DRAWINGS

The disclosure includes various illustrations by way of example, and not by way of limitation in the figures and accompanying drawings, in which like reference numerals refer to similar elements.

FIG. 4 is one embodiment of a joint encoding reference table.

DETAILED DESCRIPTION

Methods and apparatuses for bit allocation are described. An algorithm is used to jointly encode track information from among multiple subframes of a frame of data to be encoded. Joint encoding may lower the encoding bit rate, and thus preserve bandwidth.

Speech compression deals with receiving a data signal in analog form and filtering and encoding the signal in a bitstream to send to a receiver/decoder. Each bit in the bitstream transmits information to the decoder based on its position in the bitstream. The data signal and encoded bitstream are typically dealt with in blocks of data, or frames, that may be divided into multiple subframes. Each subframe of data is filtered and encoded to result in a stream of bits that is received at a decoder.

For example, speech codecs may be designed based on standards that define a frame of data as including a number of pulse positions within a specific sequence of bits in the frame. The pulses within the sequence are used to derive an excitation vector to use in decoding the compressed signal. Thus, the bit allocation defined between a codec pair allows for transmission of compressed signals between the encoder and decoder.

Figure 1:
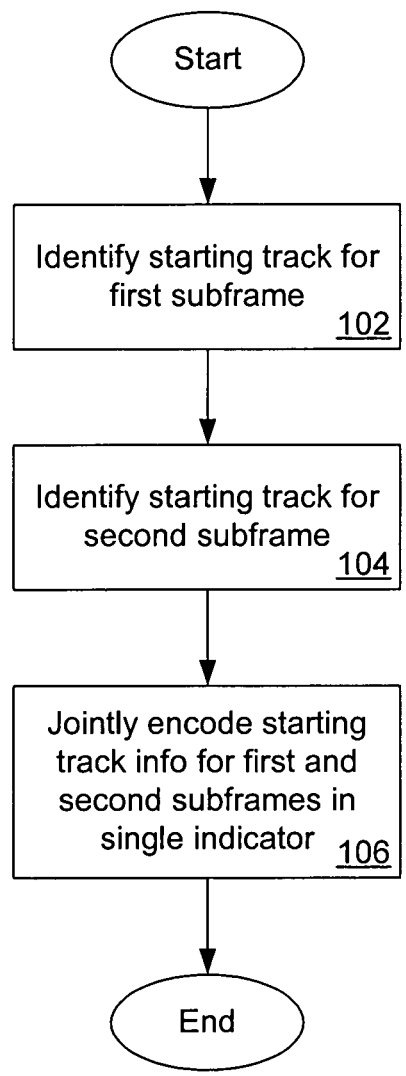
FIG. 1 is one embodiment of a flow diagram of aspects of a bit allocation algorithm.

FIG. 1 illustrates one embodiment of a flow diagram of aspects of a bit allocation algorithm. The standards may provide for an uneven distribution of pulses among the tracks, such that one or more tracks may include an extra pulse(s).

Thus, the encoder should include an indication of which track(s) include extra pulse(s) in the frame sent to the decoder. This indicator is often referred to as indicating the starting track, meaning the first track with extra pulse positions. The track indicator may be a set of bits sent with each subframe indicating which track in the subframe is the starting track.

As indicated above, one compression standard is the Algebraic-Code-Excited Linear-Prediction (ACELP), with a derivative being Conjugate-Structure ACELP (CSACELP). The ITU-T (International Telecommunication Union Telecommunication Standardization Sector) has defined the G.729 digital transmission system standard based on CSACELP. As with other speech coding standards, ITU-T G.729 specifies a coding bit rate. G.729 is defined to operate at 8.0 kbit/s for compression of normal speech signals, with extension G.729E defined to operate at 11.8 kbit/s for compression of a wider range of signals, including speech with noise, etc. G.729E defines 2 subframes, each with 5 tracks, each track containing 8 pulse positions, for a total of 40 pulse positions in which to define an excitation vector in the frame. The distribution of pulse positions is such that track T0 has positions (0, 5, 10, . . . ), T1 has positions (1, 6, 11, . . . ), etc.

G.729E specifies the use of 12 pulses, giving an uneven distribution of pulses across the five tracks, with two of the five tracks having three pulses, and the other three having two pulses. One of the two tracks with an extra pulse is identified as a starting track, which is indicated to the decoder for proper decoding alignment. A starting track indicator is sent at the beginning of each subframe, using 3 bits each to indicate one of the five tracks. But note that because three bits are used, there will be three unused combinations. This means that in a frame with two subframes, there will be three unused combinations in each of the two starting track indicators. The end result will be that the equivalent of an extra bit of empty information is sent with every frame. This may be avoided by jointly encoding the starting track information of the separate subframes into a single track indicator that indicates the starting track for multiple subframes.

For example, an encoder will identify which of the multiple tracks in each subframe is to be the starting track for each respective subframe. This information is transmitted as a joint track indicator to the decoder to ensure proper alignment at the decoder. As illustrated in FIG. 1, a starting track is identified for both the first and the second subframes, 102 and 104. Although two subframes are illustrated in FIG. 1, the skilled artisan will appreciate that a frame subdivided into more subframes can be used. Thus, additional steps in FIG. 1 might be to find a starting track for any additional subframes that might be present in a frame of data transmitted between an encoder and decoder.

Starting track information is jointly encoded, 106. Where a starting track was identified for each subframe of the frame of data, a single indicator is generated to represent the starting track for all subframes. Thus, in contrast to sending a starting track indicator with each subframe, a single starting track indicator that indicates the starting track information for all subframes is sent with the frame. One way to format such a joint indicator is to pre-define a set of values of a joint track indicator that will correspond to a set of ordered pairs. For example, instead of sending a starting track indicator at the beginning of a first subframe to indicate track T0, and a second starting track indicator at the beginning of a second subframe indicating track T2, a joint track indicator could be sent to the decoder that the decoder will interpret as indicating an ordered pair (T0, T2). For example, the decoder may include a look-up table (LUT) that will use the joint indicator as a search key. In another embodiment, the information could be hard-coded into the processing software on the decoder, so that receiving a joint track indicator of a certain value will cause a particular code branch or process to execute. The decoder may then proceed to decode using this information to align the first subframe on starting track T0, and the second subframe on starting track T2.

Figure 3:
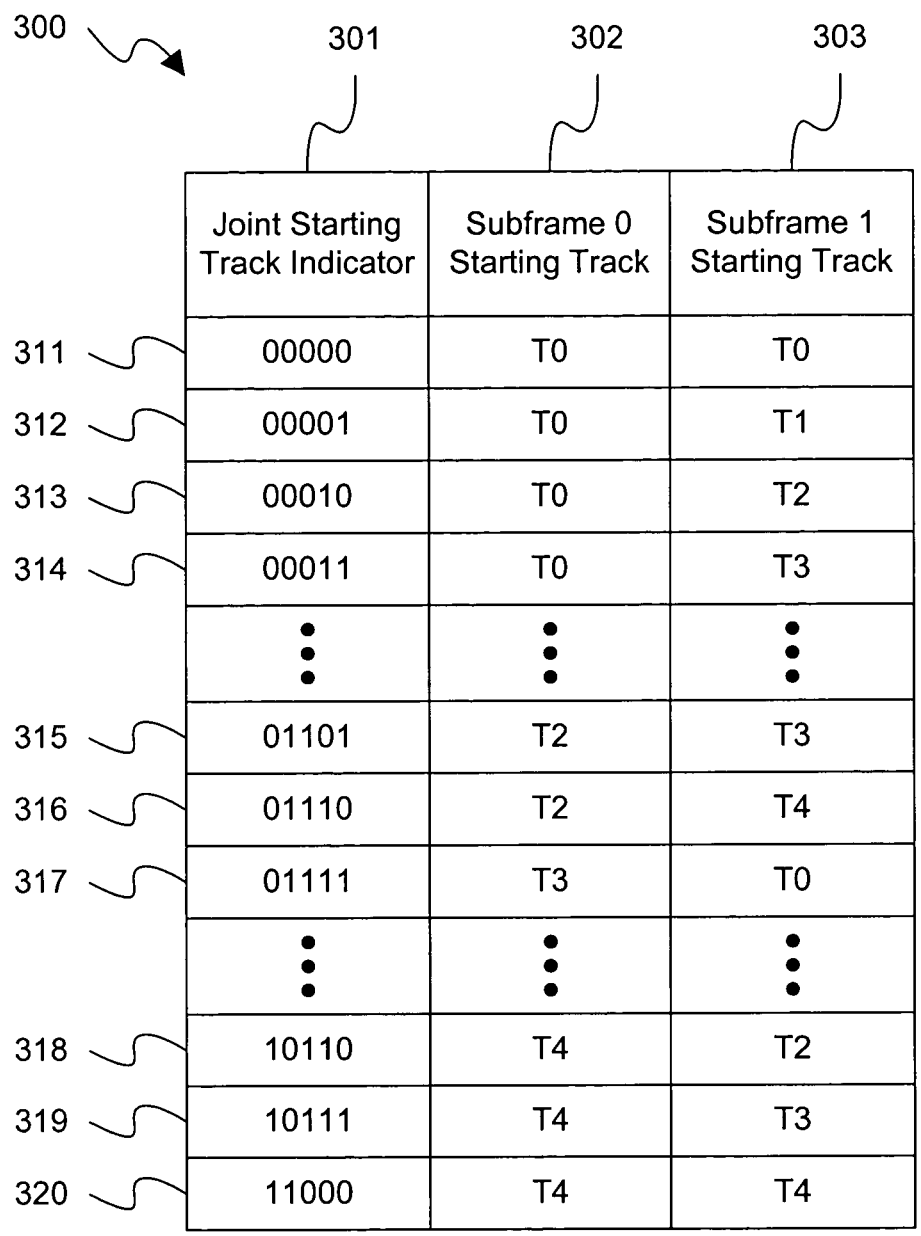
FIG. 3 is one embodiment of a joint encoding reference table.

For further illustration, consider G.729E that defines five tracks per each of two subframes. Because there are five tracks, three bits are required to send a starting track indicator ($2^2<5<2^3$, so 3 bits needed). In the previous example, the starting track indicator for the first subframe could be represented by a three-bit value, e.g., [000], and the starting track indicator of the second subframe by, e.g., [010]. To send the starting track information for both subframes would then require six bits. However, notice that if there are five tracks in both the first subframe and second subframes, there will only be 5×5=25 combinations of ordered pairs needed to represent each possible combination of starting tracks for the two subframes. This would only require five bits ($2^4<25<2^5$) instead of the six bits used to send the information in separate subframes. Thus, a five-bit joint starting track indicator of value, e.g. [00010] could be used to correspond to the starting track pair (T0, T2). The use of a five-bit joint track indicator can save 1 bit per frame over using two separate three-bit indicators, and still transmit the same information. This provides for a compression/decompression algorithm with equivalent quality as the standard of G.729E, with no greater complexity, but with a savings of one bit per frame. A possible predefined table of values of track indicator to ordered pairs for two subframes is shown in FIG. 3. FIG. 4 illustrates a possible predefined table of values for a track indicator that corresponds to ordered sets for three subframes, in the same manner as discussed above.

Figure 2A:
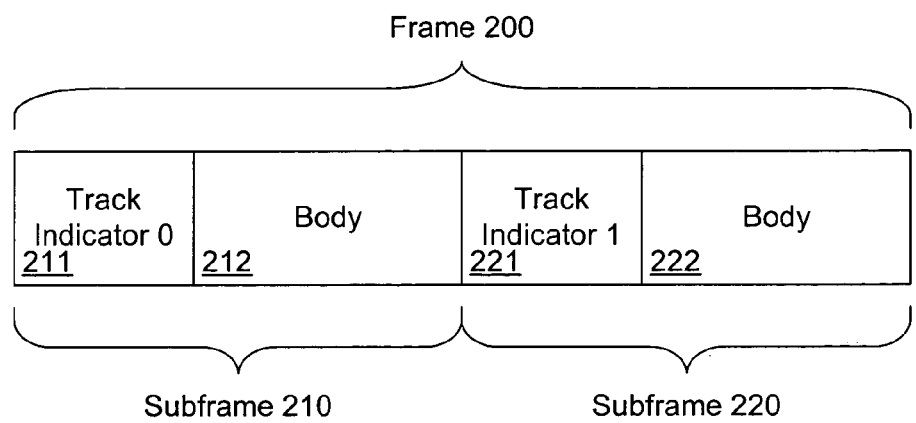
FIG. 2A is a prior art embodiment of a frame of encoded data.

FIG. 2A is a prior art embodiment of a frame of encoded data. Frame 200 includes subframes 210 and 220. Each subframe 210 and 220 has a body 212 and 222, respectively. In a signal coding system, the body may have separate tracks of pulses encoded by an encoder from which a decoder will construct an excitation vector. Note that in FIG. 2A, there is a track indicator 0 211 for subframe 210 to encode the information necessary to indicate to a decoder an identified track. The identified track may be, for example, a starting track of multiple tracks in body 212. The decoder may use the identified track, for example, for purposes of alignment. There is a separate track indicator 1 221 sent for subframe 220. It will likewise indicate an identified track, such as a starting track, of multiple tracks in body 222.

Figure 2B:
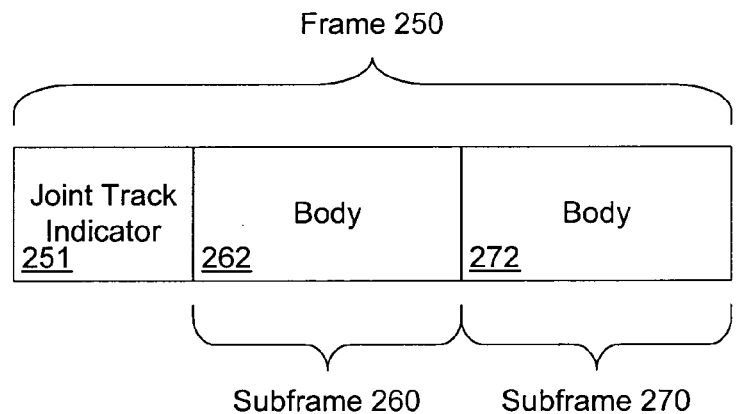
FIG. 2B is one embodiment of a frame of encoded data.

FIG. 2B is one embodiment of a frame of encoded data. Frame 250 includes subframes 260 and 270, which include bodies 262 and 272, respectively. Subframes 260 and 270 may include multiple tracks in each subframe, one of which may be indicated for each subframe. Rather than sending a separate track indicator for the separate subframes, frame 250 includes joint track indicator 251. Joint track indicator may be viewed as logically separate from the subframes of frame 250, or as a logical part of one of the subframes of frame 250. If viewed as a logical part of one sub frame, frame 250 may simple be defined to have a sub frame that is encoded with a greater number of bits than the other sub frames in the frame, and this sub frame having the information of joint track indicator 251.

With a single track indicator, the identified track for all subframes in a frame (in this case, identified tracks for both subframes 260 and 270) are indicated with a single indicator. The single indicator may provide for better use of bandwidth. Bandwidth can be preserved by using the principle that for certain combinations of numbers of tracks and subframes, a single track indicator may indicate one of the combinations with fewer bits than would be required to indicate a certain track for every subframe in a frame with separate track indicators.

FIG. 3 is one embodiment of a joint encoding reference table. Table 300 includes rows 311-320 and columns 301-303. Table 300 could be included as a Look-Up Table (LUT) or other software structure in the software for a codec. Table 300 would thus be stored on a codec for use in the codec during encoding/decoding operations. Table 300 may also be generated at start-up and placed in volatile storage. In one embodiment table 300 does not exist as an accessible code structure in memory, but rather the information shown as table 300 is hardcoded directly into the codec processing software. In this case the software, when executed, may directly use the joint track indicator to determine where to branch (as in a series of conditional branches), or a particular process to operate, or provide input to a particular process that will be executed, etc.

In one embodiment table 300 has a joint starting track indicator, row 301. The joint starting track indicator 301 illustrates a bit pattern, or binary value, that corresponds to a starting track indicator that an encoder will send to a decoder. Thus, on the decoder side, the decoder will interpret joint starting track indicator 301 as indicating that the starting track of subframe 0 is the starting track indicated in subframe 0 starting track, column 302. A corresponding entry in subframe 1 starting track, column 303, indicates the starting track of subframe 1. Note that in this fashion an entry in joint starting track indicator 301 corresponds to an ordered pair consisting of (subframe 0 starting track, subframe 1 starting track).

The rows 311-320 indicate what ordered pairs may correspond to what joint track indicator bit pattern. Thus, for example, at row 311, joint track indicator of value "00000" corresponds to ordered pair (T0, T0), at row 315 joint track indicator of value "01101" corresponds to ordered pair (T2, T3), and so forth.

Note that while columns 301-303 make reference to a "starting track," the same procedure could be used for any track of interest. The expression "starting track" is thus used simply by way of illustration and not limitation. Also note that the entries in table 300 are set forth in logical numerical order, with the lowest numbered ordered pairs corresponding to the lowest numbered joint starting track indicator. However, other associations of joint starting track indicator and ordered pairs may be made, depending on the system implementation and software/firmware on which the teachings herein may be implemented.

FIG. 4 is one embodiment of a joint encoding reference table. As with FIG. 3, table 400 may be stored in a codec system and/or coded directly into the software/firmware implementing the codec functions. Table 400 illustrates that an encoder will associate a particular bit-set, represented in joint starting track indicator, 401, as a short-hand representation for an ordered set, as in columns 402-404, and a receiving decoder will understand that the particular ordered set of columns 402-404 is represented by the particular bit-set. Thus, FIG. 4 points out one possible allocation of bit patterns to indicate starting tracks in a system that has three subframes.

Note that other configurations may be used beside those illustrated in FIGS. 3 and 4. There may also be many configurations that would not necessarily save bandwidth by using fewer bits to encode the same information, for example, a frame of two subframes with three tracks per subframe (separate starting track indicators for the two subframes would require two bits each ($2^1<3<2^2$), and a joint track indicator would require four bits ($2^3<9<2^4$)). Such a configuration could be used for purposes other than bit-saving, such as convenience, or use in conjunction with a system that uses the procedure to save bits.

Figure 5:
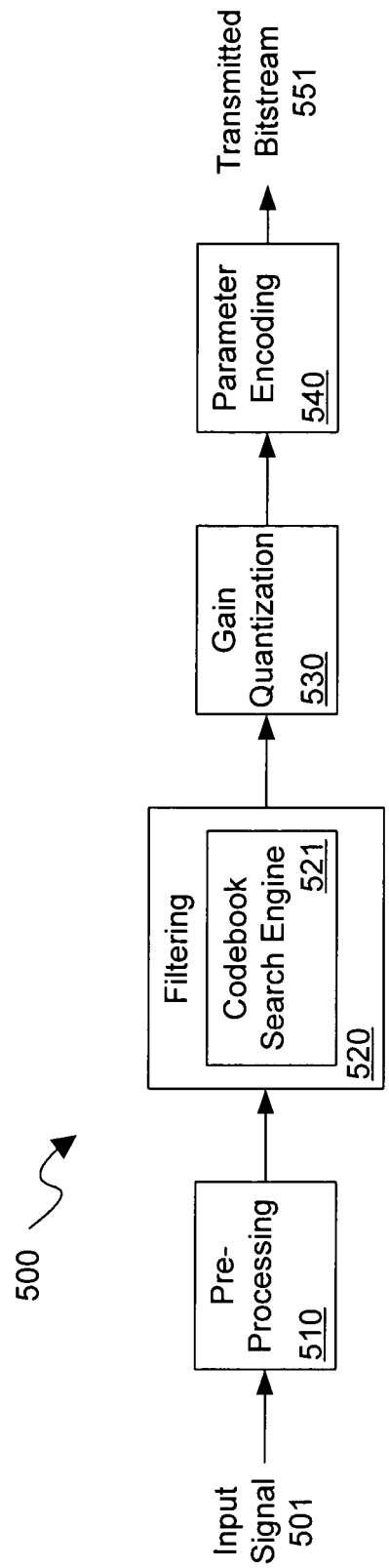
FIG. 5 is one embodiment of a block diagram of an encoding unit.

FIG. 5 is one embodiment of a block diagram of an encoding unit. System 500 represents an overview of major system elements of an encoding unit. System 500 may include many sub-elements in each of the elements shown in FIG. 5. In one embodiment system 500 is a system that complies with ITU-T G.729E.

Input signal 501 is the target signal to transmit. Input signal 501 is received at pre-processing 510 that may perform, e.g., signal scaling and/or high-pass filtering. Such pre-processing may perform functions such as reducing the possibility of overflow, or removing undesired frequency components.

A pre-processed signal is then filtered by filtering 520. Filtering 520 may perform functions such as, but not limited by: linear prediction, autocorrelation, pitch analyses, impulse response computations, adaptive codebook search, fixed codebook search, etc. In one embodiment filtering 520 includes codebook search engine 521 to perform searches of the codebooks to determine how to encode the signal, and what information will be needed to indicate to a corresponding decoder how to extract the signal. The resulting signal will include the pulse positions for encoding and decoding the target signal.

In one embodiment system 500 includes gain quantization 530 to vector quantize codebook gains. For example, a fixed-codebook and/or a pitch gain may be vector quantized using 7 bits. A gain codebook search is done by minimizing the mean-squared weighted error between original and reconstructed speech.

Parameter encoding 540 includes the process of creating the encoded bitstream that will become transmitted bitstream 551 sent to the decoder. The format of the bitstream will be dependent on the configuration of system 500. For example, in one embodiment transmitted bitstream 551 will be created that includes two subframes in a frame, with the first bits of the frame to include a joint starting track indicator for both subframes. Transmitted bitstream 551 may be transmitted over some sort of transmission medium known in the art, for example, but not limited to, a wireline transmission line, a wireless communication transmission module, etc.

Reference herein to "one embodiment" or "an embodiment" means that a particular feature, structure or characteristic described in connection with the embodiment is included in at least one embodiment of the present invention. Thus, the appearance of phrases such as "in one embodiment," or "in another embodiment" describe various embodiments of the invention, and are not necessarily all referring to the same embodiment. Besides the embodiments described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. A method for encoding data, comprising:
   encoding a first and a second subframe of a frame of data, each subframe having multiple tracks;
   identifying one of the multiple tracks for each subframe; and
   generating a track indicator to indicate to a decoder the identified track for both subframes.

2. A method according to claim 1, wherein encoding the subframes having multiple tracks comprises encoding subframes, each having a number of tracks, the number being other than a power of two.

3. A method according to claim 2, wherein encoding the subframes having a non-power-of-two number of tracks comprises encoding subframes having 5 tracks.

4. A method according to claim 1, wherein a track has pulse positions, wherein encoding subframes having multiple tracks comprises encoding subframes having at least one track with an additional pulse position as compared to another track, and wherein identifying one of the multiple tracks for each subframe comprises identifying the at least one track with the additional pulse position.

5. A method according to claim 1, wherein encoding the subframes comprises encoding the subframes according to the ITU-T G.729E standard.

6. A method according to claim 1, wherein encoding the subframes having multiple tracks comprises encoding subframes having multiple tracks in a sequence of track locations, and wherein identifying one of the multiple tracks for each subframe comprises identifying the track location of one of the multiple tracks for each subframe, and wherein generating the track indicator comprises generating a set of bits that corresponds to the track locations for all of the identified tracks for both subframes.

7. A method according to claim 6, wherein generating the set of bits comprises generating a set of bits that corresponds to an ordered pair, a value of the first member of the pair to indicate the identified track in the first subframe, and the value of the second member of the pair to indicate the identified track in the second subframe.

8. A method according to claim 1, wherein generating a track indicator comprises jointly encoding track information for tracks in both subframes.

9. An article of manufacture comprising a machine-accessible medium having content to provide instructions to cause a device to:
encode a first and a second subframe of a frame of data, each subframe having multiple tracks;
identify one of the multiple tracks for each subframe; and
generate a track indicator to indicate to a decoder the identified track for both subframe.

10. An article of manufacture according to claim 9, wherein a track has pulse positions, wherein the content to provide instructions to cause the device to encode subframes having multiple tracks comprises the content to provide instructions to cause the device to encode subframes having at least one track with an additional pulse position as compared to another track, and wherein the content to provide instructions to cause the device to identify one of the multiple tracks for each subframe comprises the content to provide instructions to cause the device to identify the at least one track with the additional pulse position.

11. An article of manufacture according to claim 9, wherein the content to provide instructions to cause the device to encode the subframes having multiple tracks comprises the content to provide instructions to cause the device to encode subframes having multiple tracks in a sequence of track locations, and wherein the content to provide instructions to cause the device to identify one of the multiple tracks for each subframe comprises the content to provide instructions to cause the device to identify the track location of one of the multiple tracks for each subframe, and wherein the content to provide instructions to cause the device to generate the track indicator comprises the content to provide instructions to cause the device to generate a set of bits that corresponds to the track locations for all of the identified tracks for both subframes.

12. An article of manufacture according to claim 11, wherein the content to provide instructions to cause the device to generate the set of bits comprises the content to provide instructions to cause the device to generate a set of bits that corresponds to an ordered pair, a value of the first member of the pair to indicate the identified track in the first subframe, and the value of the second member of the pair to indicate the identified track in the second subframe.

13. An encoding apparatus comprising:
a receiver to receive a data stream;
processing logic to encode the data stream into a frame of data, the frame of data to have a first and a second subframe, each subframe to have multiple tracks, and the processing logic to identify one of the multiple tracks for each subframe of the received frame of data, and generate a track indicator having information to indicate to a decoder the identified track for both subframes; and
a transmitter responsive to the processing logic to transmit the generated track indicator.

14. An encoding apparatus according to claim 13, wherein the processing logic encodes a frame of data having multiple tracks with pulse positions, and encodes at least one track to have an additional pulse position as compared to another track, and wherein the processing logic identifies the at least one track with the additional pulse position.

15. An encoding apparatus according to claim 13, wherein the processing logic encodes a frame having subframes having multiple tracks in a sequence of track locations and identifies the track location of one of the multiple tracks for each subframe, and wherein the processing logic generates a set of bits that corresponds the track locations for all of the identified tracks for both subframes.

16. An encoding apparatus according to claim 15, wherein the processing logic generates a set of bits that corresponds to an ordered pair, a value of the first member of the pair to indicate the identified track in the first subframe, and the value of the second member of the pair to indicate the identified track in the second subframe.

17. A coding system comprising:
a speech encoder having:
a receiver to receive a data stream;
processing logic to encode the data stream into a frame of data, the frame of data to have a first and a second subframe, each subframe to have multiple tracks, and the processing logic to identify one of the multiple tracks for each subframe of the received frame of data, and generate a track indicator having information to indicate to a decoder the identified track for both subframes; and
a transmitter responsive to the processing logic to transmit the generated track indicator; and
a transmission line coupled with the transmitter to transport the generated track indicator.

18. A coding system according to claim 17, wherein the processing logic encodes a frame of data having multiple tracks with pulse positions, and encodes at least one track to have an additional pulse position as compared to another track, and wherein the processing logic identifies the at least one track with the additional pulse position.

19. A coding system according to claim 17, wherein the processing logic encodes a frame having subframes having multiple tracks in a sequence of track locations and identifies the track location of one of the multiple tracks for each subframe, and wherein the processing logic generates a set of bits that corresponds the track locations for all of the identified tracks for both subframes.

20. A coding system according to claim 19, wherein the processing logic generates a set of bits that corresponds to an ordered pair, a value of the first member of the pair to indicate the identified track in the first subframe, and the value of the second member of the pair to indicate the identified track in the second subframe.

* * * * *